United States Patent
Liu et al.

(10) Patent No.: US 9,231,603 B2
(45) Date of Patent: Jan. 5, 2016

(54) DISTRIBUTED PHASE DETECTION FOR CLOCK SYNCHRONIZATION IN MULTI-LAYER 3D STACKS

(71) Applicant: INTERNATIONAL BUSINESS MACHINES CORPORATION, Armonk, NY (US)

(72) Inventors: Yong Liu, Rye, NY (US); Liang-Teck Pang, White Plains, NY (US); Phillip J. Restle, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 82 days.

(21) Appl. No.: 14/230,859

(22) Filed: Mar. 31, 2014

(65) Prior Publication Data

US 2015/0280722 A1   Oct. 1, 2015

(51) Int. Cl.
*H03K 5/01* (2006.01)
*H03L 7/087* (2006.01)

(52) U.S. Cl.
CPC ........................................ *H03L 7/087* (2013.01)

(58) Field of Classification Search
CPC combination set(s) only.
See application file for complete search history.

(56) References Cited

U.S. PATENT DOCUMENTS

| | | | |
|---|---|---|---|
| 7,317,342 B2 | 1/2008 | Saint-Laurent | |
| 7,623,398 B2 | 11/2009 | Arai | |
| 7,800,551 B2 | 9/2010 | McCown | |
| 7,863,960 B2 | 1/2011 | Wang et al. | |
| 7,994,822 B2 | 8/2011 | Otsuga et al. | |
| 8,040,155 B2 | 10/2011 | Tran Vo et al. | |
| 8,525,569 B2 * | 9/2013 | Bucelot et al. | 327/293 |
| 8,587,357 B2 * | 11/2013 | Kim et al. | 327/296 |
| 2011/0102044 A1 | 5/2011 | Peng | |
| 2011/0187429 A1 | 8/2011 | Byeon et al. | |
| 2013/0049827 A1 | 2/2013 | Bucelot et al. | |

OTHER PUBLICATIONS

Geannopoulos, G., et al. "An Adaptive Digital Deskewing Circuit for Clock Distribution Networks" 1998 IEEE International Solid-State Circuits Conference, 1998. Digest of Technical Papers. Feb. 1998. pp. 400-401.

Gutnik, V., et al. "Active GHZ Clock Network Using Distributed PLLS" IEEE Journal of Solid-State Circuits, vol. 35, No. 11. Nov. 2000. pp. 1553-1560.

Javidan, M., et al. "All-Digital PLL Array Provides Reliable Distributed Clock for Socs" 2011 IEEE International Symposium on Circuits and Systems (ISACS). May 2011. pp. 2589-2592.

(Continued)

*Primary Examiner* — An Luu
(74) *Attorney, Agent, or Firm* — Tutunjian & Bitetto, P.C.; Preston J. Young

(57) ABSTRACT

There is provided a clock distribution network for synchronizing global clock signals within a 3D chip stack having two or more strata. The clock distribution circuit includes, on each of the two or more strata, phase detectors, a logic circuit, and a phase de-skewing element. Each phase detector has a respective output for providing phase information relating to a phase difference between two of the global clocks signals on respective different ones of the two or more strata. The logic circuit is connected to the respective outputs of the phase detectors for determining a phase adjustment plan for a given one of the two or more strata upon which the logic circuit is located responsive to the phase information. The phase de-skewing element is for adjusting a clock skew of a same stratum located one of the two of the global clock signals responsive to the phase adjustment plan.

20 Claims, 10 Drawing Sheets

(56) References Cited

OTHER PUBLICATIONS

Kappor, A., et al. "A Novel Clock Distribution and Dynamic De-Skewing Methodology" IEEE/ACM International Conference on Computer Aided Design, 2004. Nov. 2004. pp. 626-631.

Kodama, H., et al. "Frequency-Hopping Vernier Clock Generators for Multiple Clock Domain Socs" IEEE 2004 Custom Integrated Circuits Conference. Oct. 2004. pp. 91-94.

Pavlidis, V., et al. "Clock Distribution Networks in 3-D Integrated Systems" IEEE Transactions on very large scale integration (VLSI) systems, vol. 19, No. 12, Dec. 2011. pp. 2256-2266.

Tam, S., et al. "Clock Generation and Distribution for the First IA-64 Microprocessor" IEEE Journal of Solid-State Circuits, vol. 35, No. 11. Nov. 2000. pp. 1545-1552.

\* cited by examiner

DISTRIBUTED PHASE DETECTION FOR CLOCK SYNCHRONIZATION IN MULTI-LAYER 3D STACKS

GOVERNMENT RIGHTS

This invention was made with Government support under Contract No.: H98230-07-C-0409 (National Security Agency). The Government has certain rights in this invention.

BACKGROUND

1. Technical Field

The present invention relates generally to integrated circuits and, in particular, to distributed phase detection for clock synchronization in multi-layer 3D stacks.

2. Description of the Related Art

A three-dimensional (3D) stacked chip includes two or more electronic integrated circuit chips (referred to as strata or stratum) stacked one on top of the other. The strata are connected to each other with inter-strata interconnects that could use C4 bump or other technology, and the strata could include through-Silicon vias (TSVs) to connect from the active electronics on one side of the stratum to the opposite side of the stratum. The active electronics can be on the "front" or "back" side of the stratum.

However, the synchronization of a global clock for the stacked chip poses a number of problems. These problems relate to a set of constraints that should be imposed on the synchronization. The set of constraints include, but are not limited to, the following: strata must be testable at the target clock frequency before stacking; inter-stratum and within stratum skews must be small over the entire clock mesh; low power and area overheads; applicable to both grid and non-grid clock networks; and capable of tracking layer-to-layer clock skew due to process, voltage, and temperature variations using a feedback loop.

SUMMARY

According to an aspect of the present principles, there is provided a clock distribution network for synchronizing global clock signals within a 3D chip stack having two or more strata. The clock distribution circuit includes, on each of the two or more strata, a plurality of phase detectors, a logic circuit, and a phase de-skewing element. Each of the plurality of phase detectors have a respective output for providing phase information relating to a phase difference between two of the global clocks signals on respective different ones of the two or more strata. The logic circuit is connected to the respective outputs of the plurality of phase detectors for determining a phase adjustment plan for a given one of the two or more strata upon which the logic circuit is located responsive to the phase information. The phase de-skewing element is for adjusting a clock skew of a same stratum located one of the two of the global clock signals responsive to the phase adjustment plan.

According to another aspect of the present principles, there is provided a clock distribution network for synchronizing global clock signals within a 3D chip stack having two or more strata. The clock distribution circuit includes, on each of the two or more strata, a clock grid, and a plurality of relay buffers. The clock grid has a plurality of sectors for providing the global clock signals to various chip locations. Each of the plurality of relay buffers is for driving a respective grouping of two or more of the plurality of sectors on a same stratum. The clock distribution circuit includes, on alternating ones of the two or more strata, a plurality of phase detectors and a plurality of logic circuits. Each of the plurality of phase detectors is for providing phase information relating to a phase difference between the global clocks signals on different ones of the two or more strata. Each of the plurality of logic circuits is connected to a respective one of the relay buffers and a respective one the plurality of phase detectors in a same one of the plurality of sectors, for determining a phase adjustment responsive to the phase information. A delay of a respective one of the plurality of relay buffers is adjusted responsive to the determined phase adjustment.

According to yet another aspect of the present principles, there is provided a method for synchronizing global clock signals within a 3D chip stack having two or more strata. The method includes providing on each of the two or more strata, a plurality of phase detectors, a logic circuit, and a phase de-skewing element. For any one of the two or more strata, the method includes providing, from the plurality of phase detectors thereon, phase information relating to a phase difference between two of the global clocks signals on respective different ones of the two or more strata. For any one of the two or more strata, the method further includes determining, by the logic circuit thereon, a phase adjustment plan for a given one of the two or more strata upon which the logic circuit is located responsive to the phase information. For any one of the two or more strata, the method also includes adjusting, by the phase de-skewing element, a clock skew of a same stratum located one of the two of the global clock signals responsive to the phase adjustment plan.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to distributed phase detection for clock
synchronization in multi-layer 3D stacks.

In an embodiment, a global clock distribution scheme is provided for synchronous 3-D chips that uses multiple phase detectors spread over the area of the clock region together with clock de-skewing circuits (e.g., including, but not limited to, a delay locked loop (DLL)) to reduce clock skew over the entire clock area. Due to the low-cost connectivity between the two chip layers enabled by local through-Silicon vias (TSVs) and micro C4 (uC4) connections in a 3D chip stack, distributed phase detection is area efficient and the overhead is limited. In a 3D chip stack, TSV delay is ~1 ps, so high-performance phase detection is achievable.

In an embodiment, the present principles can provide the following features. The present principles allow each layer to have its own clock for test purposes. When the layers are stacked, the present principles use only one (1) layer as the source of the clock to all layers. The present principles employ a de-skewing circuit on each layer to align the clock edge of every layer. The de-skewing circuits can include, e.g., multiple phase detectors spread over the entire clock area whose output is fed back to a central logic that processes it and decides how to adjust the de-skewing element. The de-skewing element and control logic can be a central unit or distributed over the clock area, controlling a subset of the clock tree. The present principles allow for the tracking of process, voltage and temperature variation between the stacks on the 3-D chip in an automated manner and takes into account the nature of 3-D stacks that uses through-silicon via(TSV) and microC4(uC4) bumps to connect a chip surface to another.

A description will now be given of area averaging of interstratum skew in a 3D chip stack with respect to FIGS. 1-3, in accordance with an embodiment of the present principles. The area averaging advantageously uses phase detection for clock synchronization in the 3D chip stack.

Figure 1:
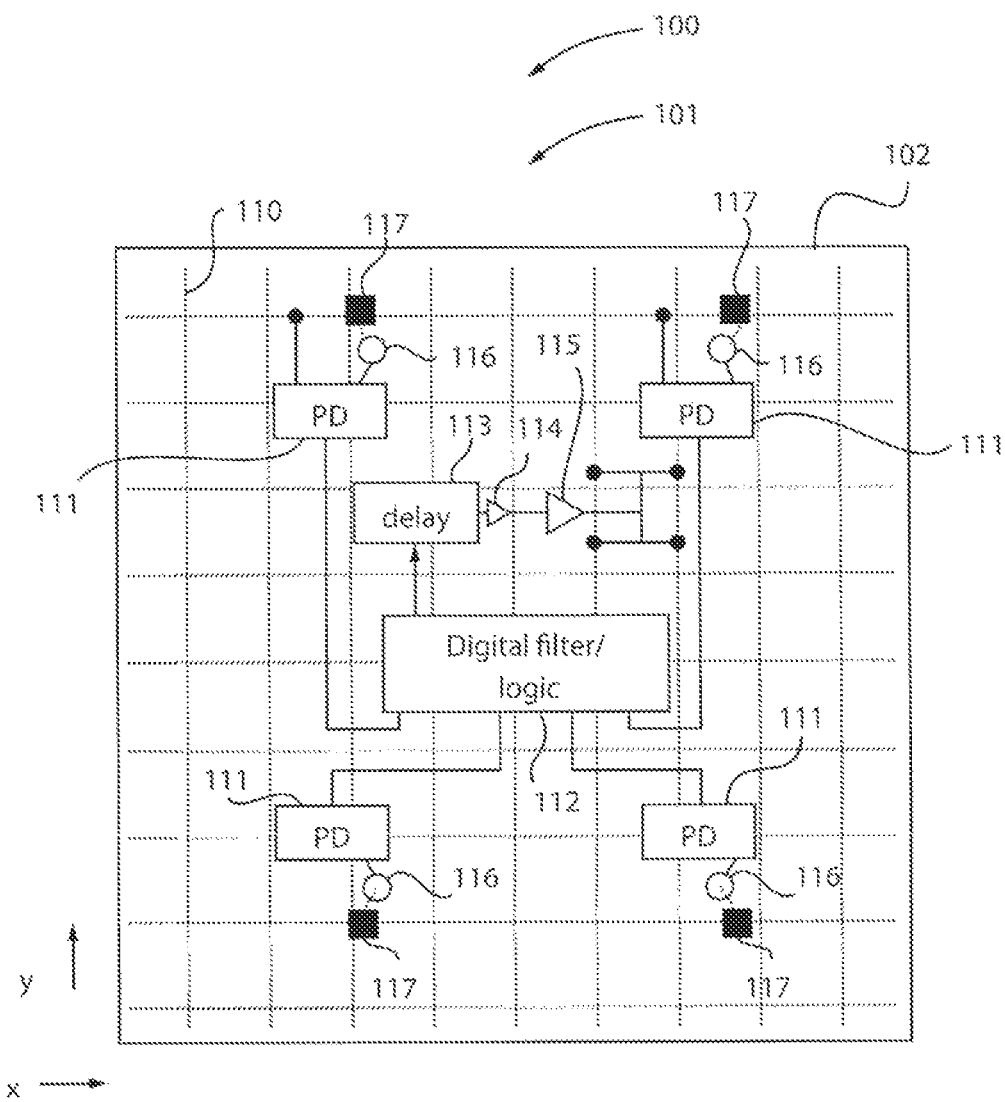
FIG. 1 shows a top view of a clock distribution circuit 101 on a stratum 102 of a 3D chip stack 100, in accordance with an embodiment of the present principles.

FIG. 1 shows a top view of a clock distribution circuit 101 on a stratum 102 of a 3D chip stack 100, in accordance with an embodiment of the present principles. The clock distribution circuit 101 includes a clock grid 110, phase detectors (PD) 111, a digital filter/logic 112, a delay element 113, a relay buffer 114, a sector buffer 115, through-Silicon vias (TSVs) 116, and micro C4 (μC4) connections 117. The digital filter/logic 112 is interchangeably referred to herein as "sum and compare circuit" since the digital filter/logic 112 is configured to perform sum and compare operations in an embodiment of the present principles.

Figure 2:
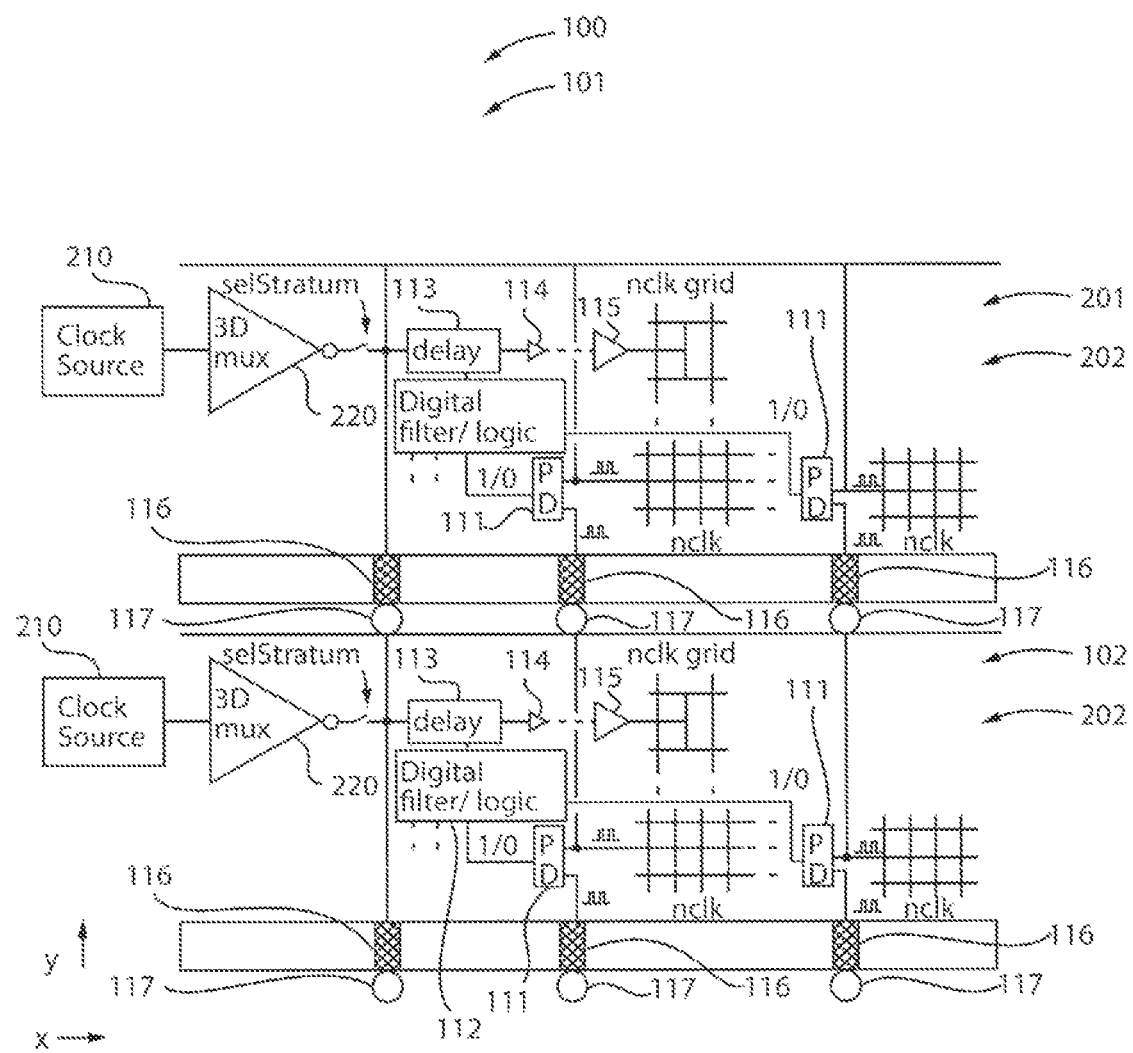
FIG. 2 shows a side view of the clock distribution circuit 101 of FIG. 1 on a stratum 102 and a stratum 201 of the 3D chip stack 100, in accordance with an embodiment of the present principles.

FIG. 2 shows a side view of the clock distribution circuit 101 of FIG. 1 on a stratum 102 and a stratum 201 of the 3D chip stack 100, in accordance with an embodiment of the present principles. Stratum 102 and stratum 201 are also referred to herein as "stratum0" and "stratum1", respectively. The clock distribution circuit 101 includes clock trees 202. Each stratum of the 3D chip stack 100 includes a respective one of the clock trees 202.

The clock trees 202 have a single clock source 210 (e.g., a phase locked loop (PLL)), selectable using a 3D multiplexer (mux) 220, for driving the root 217 of the clock trees in all strata. We note that the "final clock mesh" is interchangeably referred to herein as "final clock grid" as well as "nclk" and, hence, all are denoted by the reference numeral 288.

We note that a number of sector buffers 115 are uniformly distributed over the clock mesh and used to drive the final clock mesh 288 and each sector buffer 115 is placed in the middle of a small rectangular area of the mesh called a clock sector, while a relay buffer (or simply "buffer" in short) 114 is primarily used to relay and/or otherwise distribute the clock signal throughout the chip with the same latency in order to drive the inputs of all the sector buffers 115 in a synchronous manner.

Figure 3:
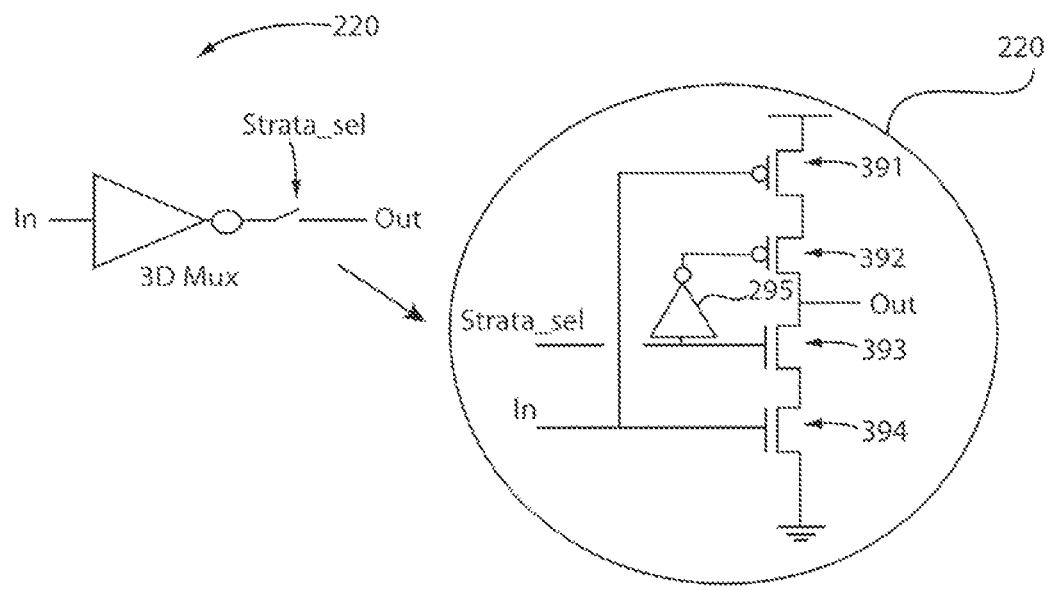
FIG. 3 further shows the 3D multiplexer 220 of FIG. 2, in accordance with an embodiment of the present principles.

FIG. 3 further shows the 3D multiplexer 220 of FIG. 2, in accordance with an embodiment of the present principles. The 3D multiplexer 220 is a tri-state multiplexor that is sized appropriately to drive all the strata in the stack. Its drive strength can be made programmable so that it can have the right drive for testing before stacking or when it is stacked with a variable number of strata. The multiplexer 220 includes two p-channel MOSFETs 391 and 392, two n-channel MOSFETS 393 and 394, and an inverter 395. The source of MOSFET 391 is connected in signal communication with a voltage or current source. The drain of MOSFET 391 is connected in signal communication with the source of MOSFET 392. The source of MOSFET 394 is connected in signal communication with ground. The drain of MOSFET 394 is connected in signal communication with the source of MOSFET 393. An output of the inverter 395 is connected in signal communication with the gate of the MOSFET 392. The drains of MOSFETs 392 and 393 are available as outputs of the 3D multiplexer 220, for providing an output signal ("out"). The gates of the MOSFETS 391 and 394 are available as inputs of the 3D multiplexer 220, for receiving an input signal ("in"). The gate of MOSFET 393 and an input of inverter 395 are available as inputs of the 3D multiplexer 220, for receiving a control signal ("strata_sel").

Thus, in the preceding Figures, several phase detectors (PD) 111 are distributed over the clock grid 110. A local clock grid signal at the PD 111 is compared to the clock grid signal in the layer below through TSV/uC4. The output of a PD 111 is a digital 1 or 0 depending on the skew of the two inputs to the PD 111. A PD output can be stored in a scan chain and moved in series to the digital filter 112 or routed directly there. Sum and compare circuit 112 adds up the outputs of the PDs 111 and adjusts the delay line 177 of a delay-locked loop (DLL—not shown) based on a comparison with thresholds. The mean clock phase of each layer is aligned.

Several differences between conventional 2D single-DLLs and 3D distributed-DLLs will now be described. Due to the low-cost connectivity between the two chip layers enabled by local TSV and uC4 in a 3D chip stack, distributed phase detection is area efficient and the overhead is limited. While in the clocking scheme between two chips in the conventional multi-chip module (MCM) package, or two separate packages, the connectivity between two chips is very costly and distributed phase detection leads to significant area and pin overhead. Additionally, the phase detection performance is also poor due to the large delay on those connections (traces on the MCM package or between two packages). On the other hand, in a 3D chip stack, TSV delay is ~1 ps, so high-performance phase detection is achievable.

In 2D clock meshes, this method can be practical only if used to align the interface between clock meshes. In a large 2D chip where the interface is on 1 side of the 2D clock mesh and extends over a long length, this method can be used to reduce the worst case skew between the 2 meshes along the interface.

Examples of digital filtering involving sum and compare operations will now be given, in accordance with an embodiment of the present principles. Consider 8 PDs, wherein the sum of the PD outputs=S. The output of a PD is 1 if the top layer is faster than the bottom layer, and 0 otherwise. The following applies with respect to DLL control:

S<4 bottom layer is faster⇒ reduce delay of top layer
S>5 bottom layer is slower⇒ increase delay of top layer
4≤S≤5 allowance for noise and jitter⇒ layers are synchronized It is to be appreciated that in an embodiment, other logic could put a different weight on each PD depending upon its location on the chip.

Figure 4:
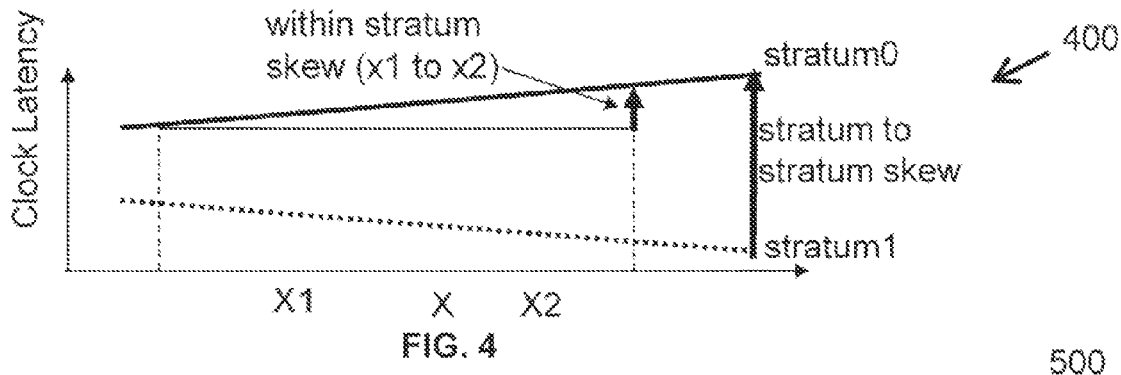
FIG. 4 shows an exemplary plot 400 of phase detector location versus clock latency for a single phase detector and a single delay element before deskewing, in accordance with an embodiment of the present principles.

FIG. 4 shows an exemplary plot 400 of phase detector location versus clock latency for a single phase detector and a single delay element before deskewing, in accordance with an embodiment of the present principles.

Figure 5:
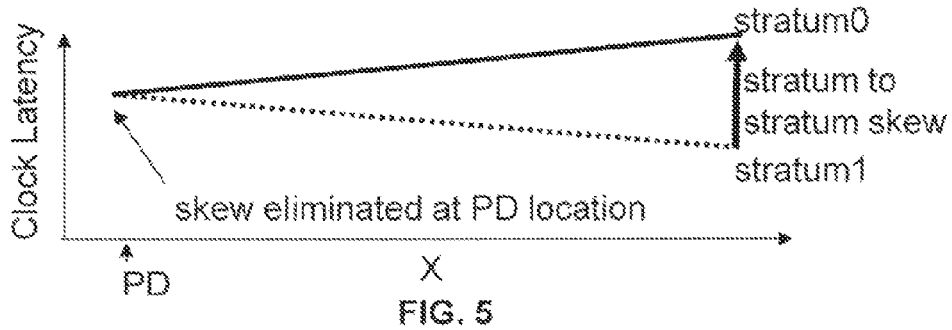
FIG. 5 shows an exemplary plot 500 of phase detector location versus clock latency for a single phase detector and a single delay element after deskewing, in accordance with an embodiment of the present principles.

FIG. 5 shows an exemplary plot 500 of phase detector location versus clock latency for a single phase detector and a single delay element after deskewing, in accordance with an embodiment of the present principles.

In the plots 400 and 500, the X-axis represents phase detector location and the Y-axis represents clock latency. On stratum0, the clock latency in this example increases with the X coordinate, while on stratum1, the clock latency decreases with the X coordinate. Such latency variations are common as the result of process variations. As shown in FIG. 5, the stratum to stratum skew is lowest at position x=0, and increases with an increasing value for x. In this example, a phase detector is hypothesized to be located at X=0. Then the delay elements 113 were adjusted to minimize the between-stratum skew at this location. With this phase detector location, the maximum skew between strata after deskewing occurs at the maximum X location. The horizontal skew within each stratum, from one X location to another X location on the same stratum is unaffected by the delay adjustment.

Figure 6:
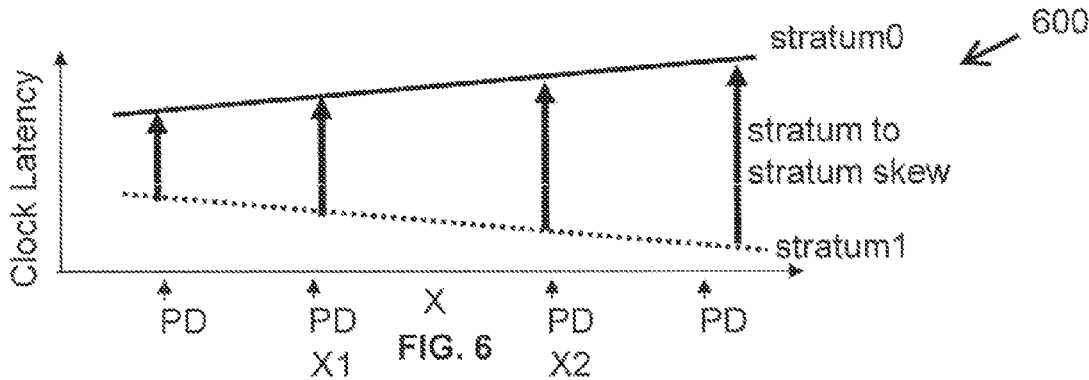
FIG. 6 shows an exemplary plot 600 of phase detector location versus clock latency for the case of four phase detectors and a single delay element before deskewing, in accordance with an embodiment of the present principles.

FIG. 6 shows an exemplary plot 600 of phase detector location versus clock latency for the case of four phase detectors and a single delay element before deskewing, in accordance with an embodiment of the present principles.

Figure 7:
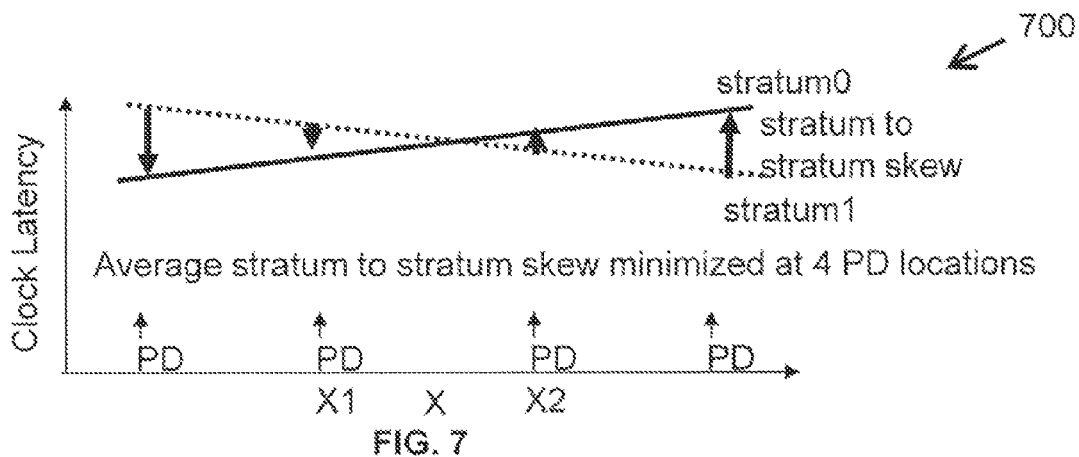
FIG. 7 shows an exemplary plot 700 of phase detector location versus clock latency for the case of four phase detectors and a single delay element after deskewing, in accordance with an embodiment of the present principles.

FIG. 7 shows an exemplary plot 700 of phase detector location versus clock latency for the case of four phase detectors and a single delay element after deskewing, in accordance with an embodiment of the present principles.

In the plots 600 and 700, the X-axis represents phase detector location and the Y-axis represents clock latency. In this case, it is hypothesized that 4 phase detectors are distributed in the X direction, with a single delay element 113 on each stratum adjusted to minimize the average stratum to stratum skew measured by the 4 phase detectors. As shown in FIG. 7, the distributed phase detection reduced the average stratum to stratum skew. In particular, the worst case inter-strata clock skew in FIG. 7 corresponds to one half (½) of the worst case inter-strata clock skew of FIG. 5. Again, as in FIG. 5, the horizontal skew with each stratum, from one X location to another X location on the same stratum is unaffected by the delay adjustment.

A description will now be given of distributed phase detection and delay adjustment in a 3D chip stack with respect to FIG. 8-13, in accordance with an embodiment of the present principles.

Figure 8:
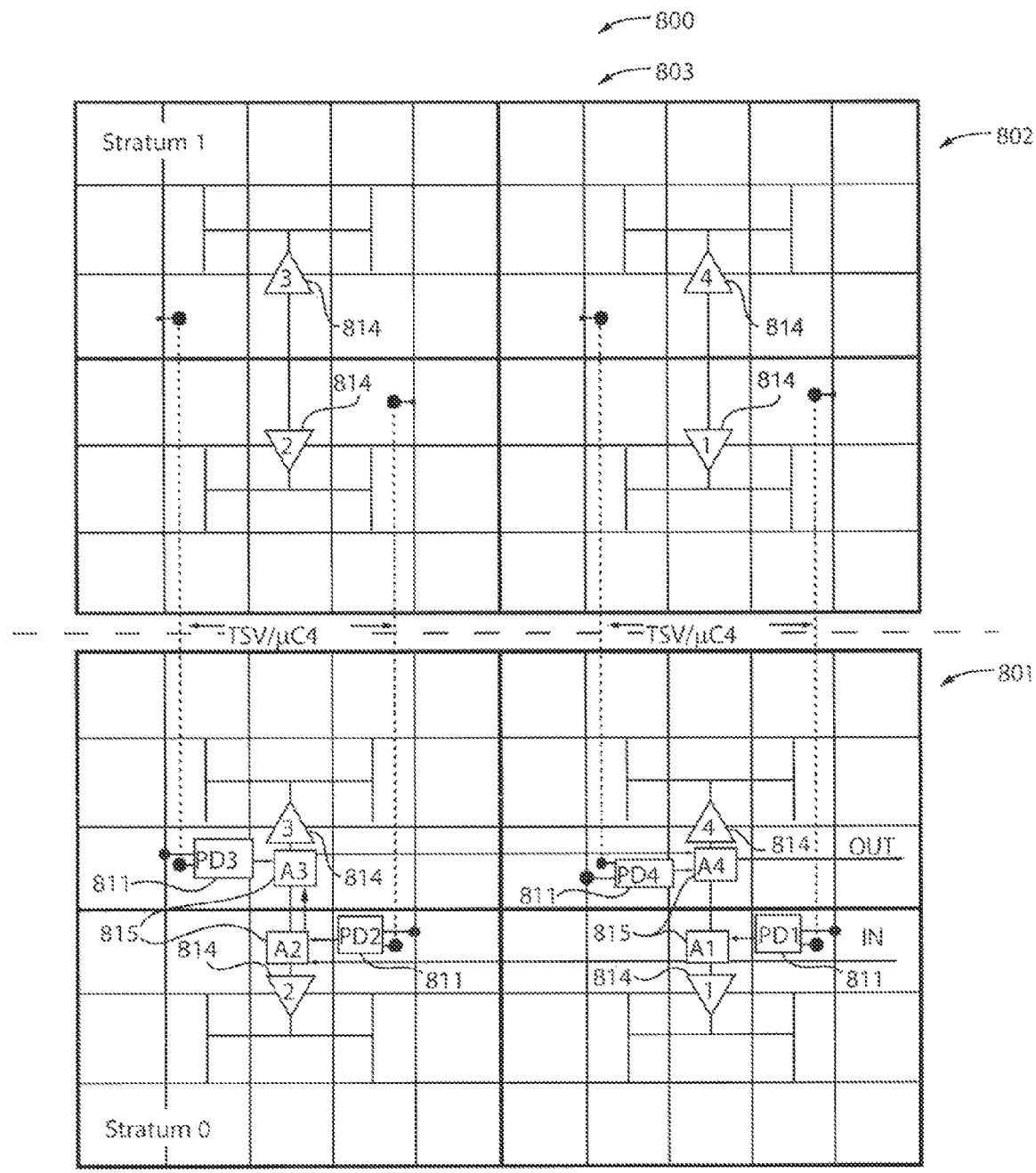
FIG. 8 shows a top view of another clock distribution circuit 803 on a stratum 801 and a stratum 802 of the 3D chip stack 800, in accordance with an embodiment of the present principles.

FIG. 8 shows a top view of another clock distribution circuit 803 on a stratum 801 and a stratum 802 of the 3D chip stack 800, in accordance with an embodiment of the present principles. Stratum 802 and stratum 801 are also referred to herein as "stratum0" and "stratum1", respectively. The clock distribution circuit includes phase detectors 811 (also designated by "PD" following by an integer), relay buffers 814, and skew adjusters (also designated by "A" following by an integer) 815 (e.g., logic with a programmable delay). The relay buffers 814 also include an integer for designating a grouping, where a common integer (among a particular phase detector, relay buffer, and skew integer) designates members of a common group. In the example of FIG. 8, each of the two strata includes 4 sectors. Each sector is driven by a sector buffer 814. Each sector is one quadrant of the clock grid (mesh) on each stratum. A sector includes a subset of the clock grid, including the buffers used to drive that subset of the clock grid. Each sector on stratum0 includes a phase detector 811.

In FIG. 2, the root of each clock tree can be adjusted to deskew the clock skews. In FIG. 8, clock sectors can be grouped together and driven by a relay buffer 814. The skew adjuster 815 can be used to adjust the delay of the relay buffer 814 instead. In that case, the skew adjuster 815 can take inputs from a group of phase detectors 811 located within the group of sectors and the delay adjust will be applied equally to each sector buffer through the relay buffer. In this way, by increasing the clock adjustment granularity, the local clock skews will be reduced, Any skew within the group will not be modified.

Instead of changing the delay with a programmable delay (e.g., using the skew adjuster 815), it is also possible to change it using programmable strength clock buffers.

The distributed delay adjust and single delay adjust are combined at the root using distributed phase detection. The prior art disadvantageous considers unconnected clock meshes and trees.

In an embodiment, an enable signal can be scanned to the skew adjusters 815 one at a time to enable the adjust logic to read its PD output and adjust its delay by 1 time step. Signals from other skew adjusters 815 are scanned in from access point IN. After going to all 4 clock sectors, signals are moved to other sectors through access point OUT.

Accompanying the enable signal can also be a lock signal for each sector. When all lock signals are true, the de-skewing will stop. The time step should be small to avoid too much skew between adjacent sectors.

A description will now be given regarding distributed phase detection and delay adjustment, in accordance with an embodiment of the present principles.

Figure 9:
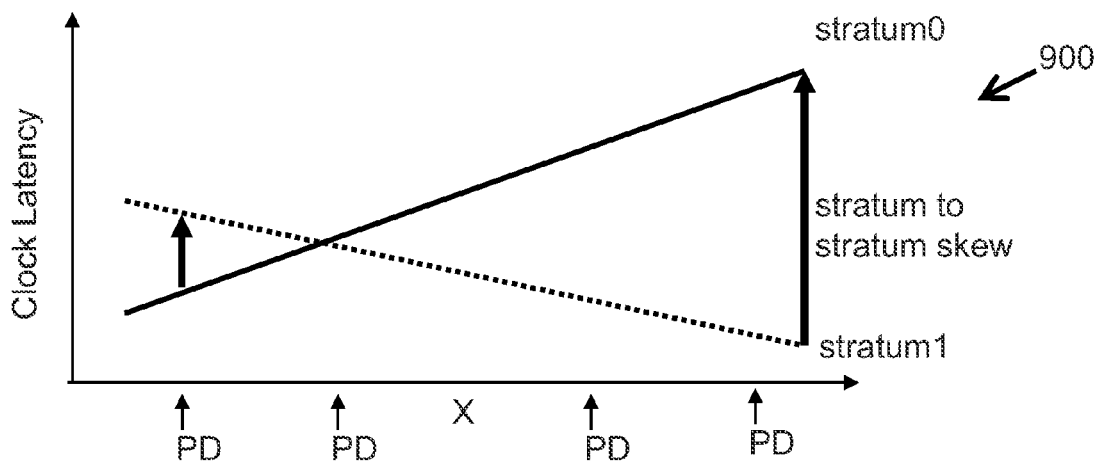
FIG. 9 shows an exemplary plot 900 of phase detector location versus clock latency for the case of four phase detectors before deskewing, in accordance with an embodiment of the present principles.

FIG. 9 shows an exemplary plot 900 of phase detector location versus clock latency for the case of four phase detectors before deskewing, in accordance with an embodiment of the present principles.

Figure 10:
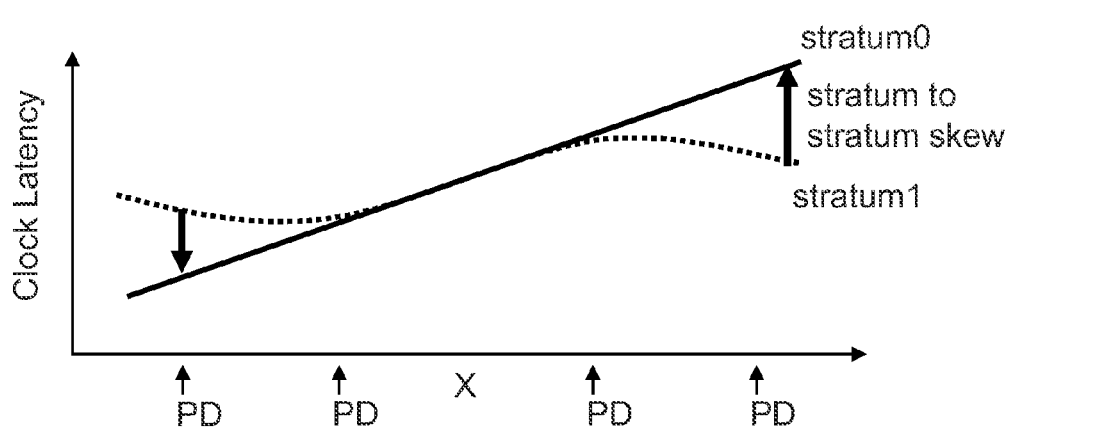
FIG. 10 shows an exemplary plot 1000 of phase detector location versus clock latency for the case of four phase detectors and two delay elements after deskewing, in accordance with an embodiment of the present principles.

FIG. 10 shows an exemplary plot 1000 of phase detector location versus clock latency for the case of four phase detectors and two delay elements after deskewing, in accordance with an embodiment of the present principles.

In the plots 900 and 1000, the X-axis represents location and the Y-axis represents clock latency. In this case there is a row of four phase detectors and two delay adjusts, representing the case of a row of 4 sectors. In this case the two delay adjusts reduce the skew more effectively than can be done by a single delay adjusts as in FIG. 7, but there still are regions of larger stratum to stratum skew that cannot be eliminated using two delay adjusts.

Figure 11:
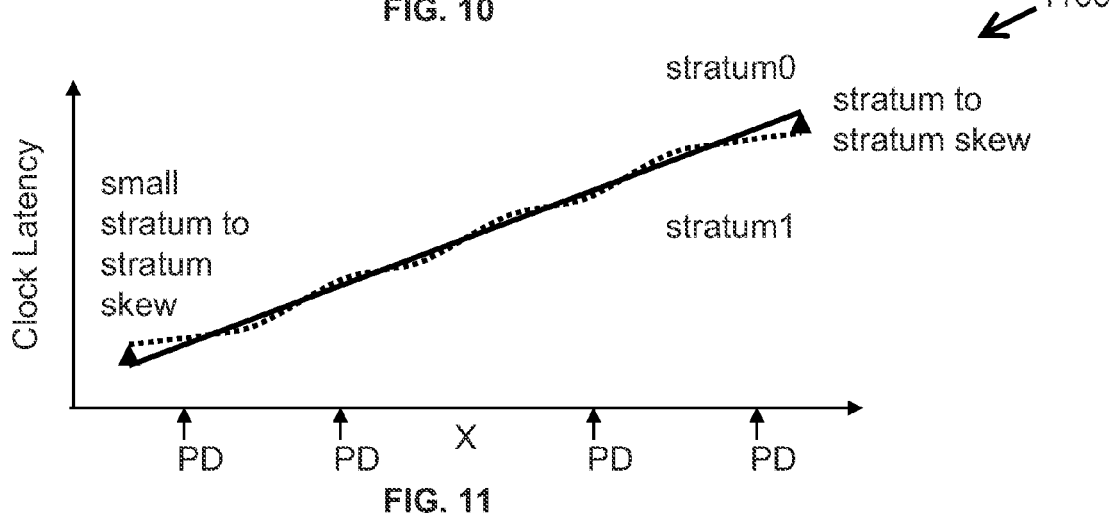
FIG. 11 shows an exemplary plot 1100 of location versus clock latency for the case with 4 sectors, with 1-phase detector and 1-delay adjust per clock sector, after deskewing, in accordance with an embodiment of the present principles.

FIG. 11 shows an exemplary plot 1100 of location versus clock latency for the case with 4 sectors, with 1-phase detector and 1-delay adjust per clock sector, after deskewing, in accordance with an embodiment of the present principles. In the plot 1100, the X-axis represents location and the Y-axis represents the clock latency. This shows how increasing both the number of phase detectors and the number of delay adjusts can reduce the skew between strata. FIGS. 7, 10, and 11 show the clock aligning performance with intra-stratum different clock skew detect and adjust granularity, in accordance with embodiments of the present principles. As explained before, FIG. 7 illustrates that the distributed phase detector in two strata combined with clock skew adjustment in the root of the clock tree on each stratum reduces the worst-case inter-stratum clock skew to ½ of the worst-case clock skew in a 3D stack with only 1 phase detector per stratum. To further reduce the inter-stratum clock skew, the clock tree in each stratum is divided into groups of clock sectors as shown in FIG. 8. In this case, each clock sector group has more than 1 clock sector and each clock sector group share one PD and clock adjuster. Only the root clock delay of the clock sector group is adjusted. By detecting and correcting the local inter-strata clock skew at the root of each clock sector group, the local inter-strata clock skew is further reduced. By doing this, each clock sector group aligns with the clock sector on its adjacent stratum. Therefore, the local inter-strata skew is reduced, as shown in FIG. 10. A further step is to add one PD and clock adjuster every clock sector, which further reduces the inter-stratum and intra-stratum clock skew, as shown in FIG. 11.

In element 112 in FIGS. 1 and 2, and element 815 in FIG. 8, a plurality of configurable scan chains can be added to scan in and store certain values of the PD output and phase adjuster settings. Each configurable scan chain includes a series of scannable configuration registers on a respective one of the two or more strata for storing outputs of the plurality of phase detectors from the respective one of the two or more strata. Such configurable scan chain feature facilitates chip testing, debugging and monitoring.

Figure 12:
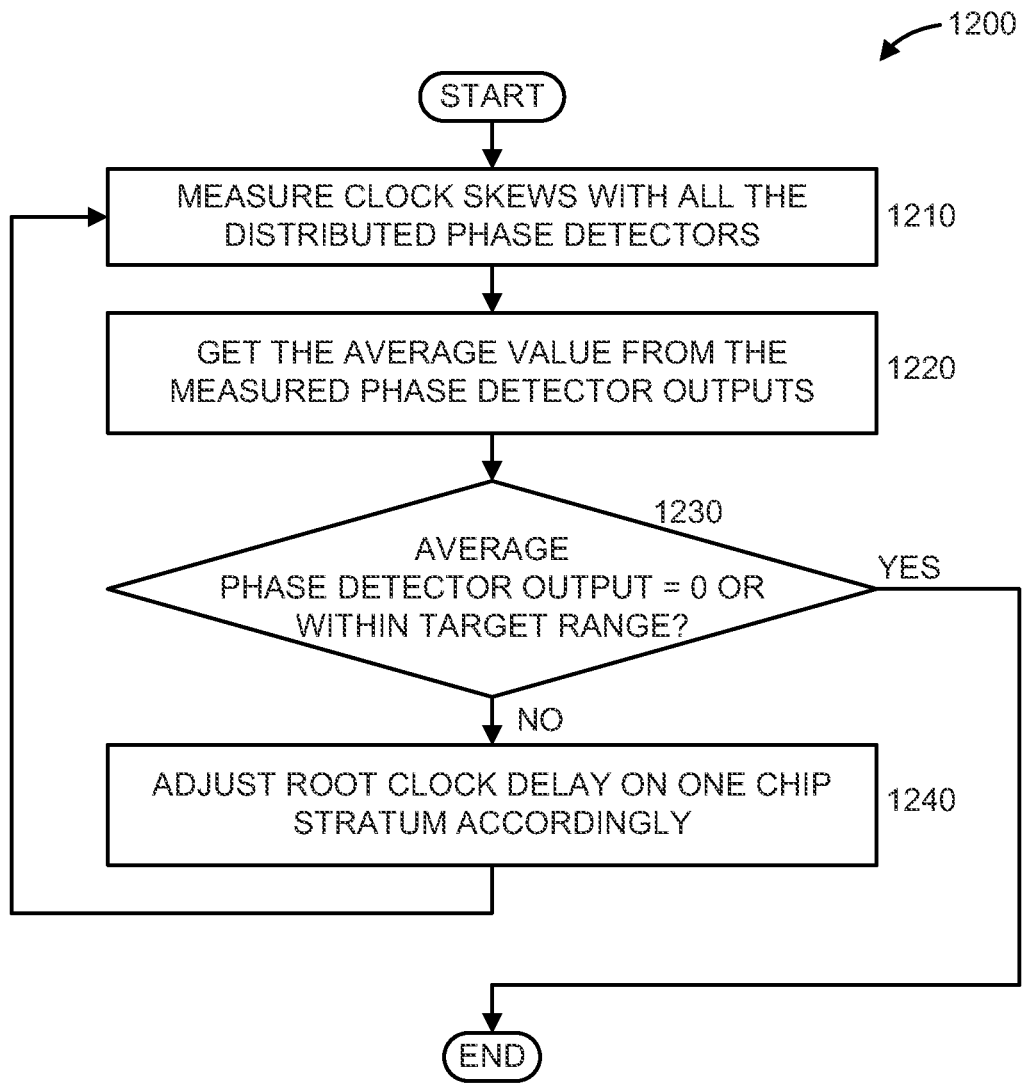
FIG. 12 shows a method 1200 for distributed phase detection and delay adjustment in a 3D chip stack, in accordance an embodiment of the present principles.

FIG. 12 shows a method 1200 for distributed phase detection and delay adjustment in a 3D chip stack, in accordance with an embodiment of the present principles. This method 1200 aligns the clocks in different chip stratum by adjusting the root clock delay on one chip stratum. At step 1210, the clock skews between the clocks on different chip stratum at all the distributed phase detectors are measured. At step 1220, the measured clock skews are sent to a central control macro, where the measured clock skews are averaged. At step 1230, this averaged clock skew is compared with either 0 or a target range. If the clock skew is 0 or within the target range, then the clock distribution calibration is done. However, if the clock skew is not 0 or is out of the target range, then the method continues to step 1240. At step 1240, the root clock delay on one chip stratum is adjusted accordingly, and the method returns to step 1210.

Let us define the clock skew defined as the clock delay on the top chip stratum minus the clock delay on the bottom chip stratum. If the measured average clock skew is larger than 0 or the positive boundary of the target range, it means that the average clock delay on the top chip stratum is larger than that on the bottom chip stratum. Then the root clock delay circuit on the bottom chip stratum will be adjusted so that it has longer clock delay, or the root delay circuit on the top chip stratum will be adjusted so that it has shorter clock delay. After the clock delay is adjusted accordingly, this calibration routine is repeated until the averaged measured clock skew is 0 or within the target range.

Figure 13:
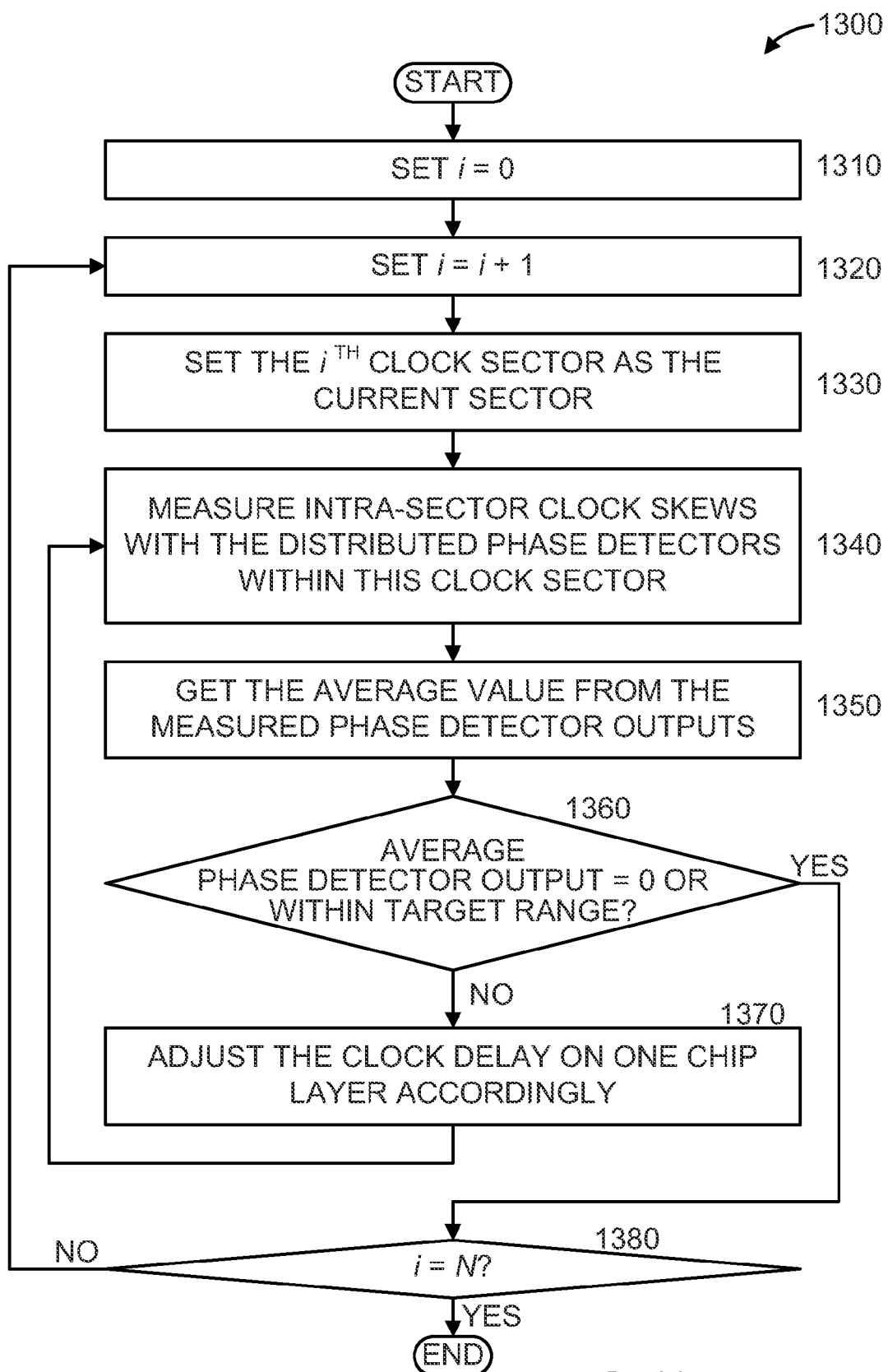
FIG. 13 shows another method 1300 for distributed phase detection and delay adjustment in a 3D chip stack, in accordance with an embodiment of the present principles.

FIG. 13 shows another method 1300 for distributed phase detection and delay adjustment in a 3D chip stack, in accordance with an embodiment of the present principles. This method 1300 aligns the clocks in clock sectors on different chip stratum by adjusting the root clock delay on one chip stratum. This method 1300 achieves greater clock alignment granularity than method 1200 of FIG. 12. First, the first clock sector is calibrated. For example, at step 1310, a variable i is set to 0. At step 1320, i is set equal to i+1. At step 1330, the $i^{th}$ clock sector is set as the current sector. At step 1340, the clock skews between the clocks on different chip stratum at all the distributed phase detectors within the first clock sector are measured. At step 1350, the measured clock skews are sent to a central control macro, where the measured clock skews are averaged. At step 1360, this averaged clock skew is compared with either 0 or a target range. If the clock skew is 0 or within the target range, then the clock distribution calibration for this clock sector is done, and the method continues to step 1380. However, if the clock skew is not 0 or out of the target range, then the method continues to step 1370. At step 1370, the root clock delay of this clock sector on one chip stratum is adjusted accordingly, and the method returns to step 1340. At step 1380, it is determined whether i=N, where N is equal to the number of clock sectors. If so, then the method is terminated. Otherwise, the method returns to step 1320.

Let us define the clock skew defined as the clock delay on the top chip stratum minus the clock delay on the bottom chip stratum. If the measured average clock skew within this clock sector is larger than 0 or the positive boundary of the target range, it means that the average clock delay within this clock sector on the top chip stratum is larger than that on the bottom chip stratum. Then the root clock delay circuit in this clock sector on the bottom chip stratum will be adjusted so that it has longer clock delay, or the root delay circuit in this clock sector on the top chip stratum will be adjusted so that it has shorter clock delay. After the clock delay is adjusted accordingly, this calibration routine is repeated until the averaged measured clock skew within this clock sector is 0 or within the target range. Then the calibration moves on to the second clock sector. The same calibration routine is repeated. When all the clock sectors have been calibrated, the calibration is complete.

Figure 14:
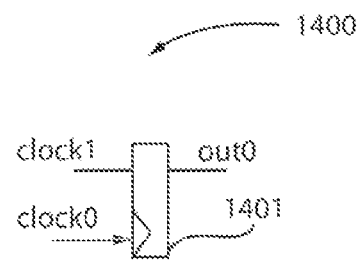
FIG. 14 shows a single latch style phase detector 1400, in accordance with an embodiment of the present principles.

FIG. 14 shows a single latch style phase detector 1400, in accordance with an embodiment of the present principles. The single latch phase detector 1400 includes a latch 1401 having a data input for receiving a first clock signal (clock1), a clock input for receiving a second clock signal (clock0), and a single output for providing an output signal (out0). A value of 1 for the output signal out0 denotes "slow". A value of 0 for the output signal out0 denotes "fast".

Figure 15:
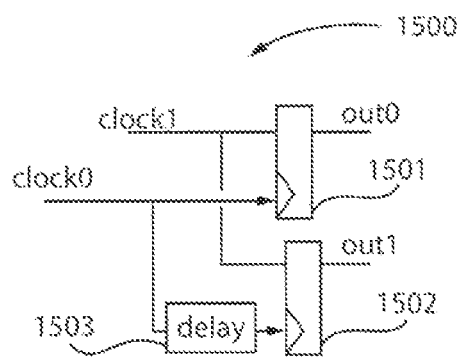
FIG. 15 shows a double latch style phase detector 1500, in accordance with an embodiment of the present principles.

FIG. 15 shows a double latch style phase detector 1500, in accordance with an embodiment of the present principles. The double latch style phase detector 1500 includes a first latch 1501, a second latch 1502, and a delay element 1503. Respective data inputs of the first latch 1501 and the second latch 1502 receive a first clock signal (clock1). A clock input of the first latch 1501 and an input of the delay element 1503 receive a second clock signal (clock0). An output of the delay element 1503 is connected to a clock input of the second latch 1502 for receiving a delayed second clock signal (clock0). An output of the first latch 1501 provides an output signal (out0). An output of the second latch 1502 provides an output signal (out1). Values of 1/1 for out0/out1 denote "slow". Values of 0/0 for out0/out1 denote "fast". Values of 0/1 or 1/0 for out0/out1 denote a "captured edge".

Adding a divider and a dummy divider at the input to a PD allows for the alignment of clocks having different frequencies.

A description will now be given regarding the adjust logic, in accordance with an embodiment of the present principles. As an example, the adjust logic can be embodied in the skew adjusters described herein (e.g., skew adjusters 815 shown in FIG. 8).

In an embodiment, we enable adjust and mode signal scan latch to be read. To that end, modes can include, but are not limited to, any of the following: (1) central adjust only: (2) local adjust only; (3) no adjust; and (4) type of filtering algorithm, if any. Regarding the central adjust only mode, all PD outputs are scanned to central adjust and local adjusts are not active. Regarding the local adjust only mode, the local adjust will function when the enable adjust signal is received and only the lock signal is sent back to the central control after reading the PD and evaluating the same.

The current PD output and address of the local adjust unit and lock signal are stored in scan latches and scanned to a central controller unit.

The previous PD and current PD outputs are stored and read by the local adjust unit.

The enable, mode, previous PD and current PD are read to decide whether to increment or decrement the programmable delay or buffer strength.

The PD inputs are filtered if dynamic tracking needed. Local filtering can be done by local adjust units and the results sent to the central adjust unit to be further filtered according to location.

Figure 16:
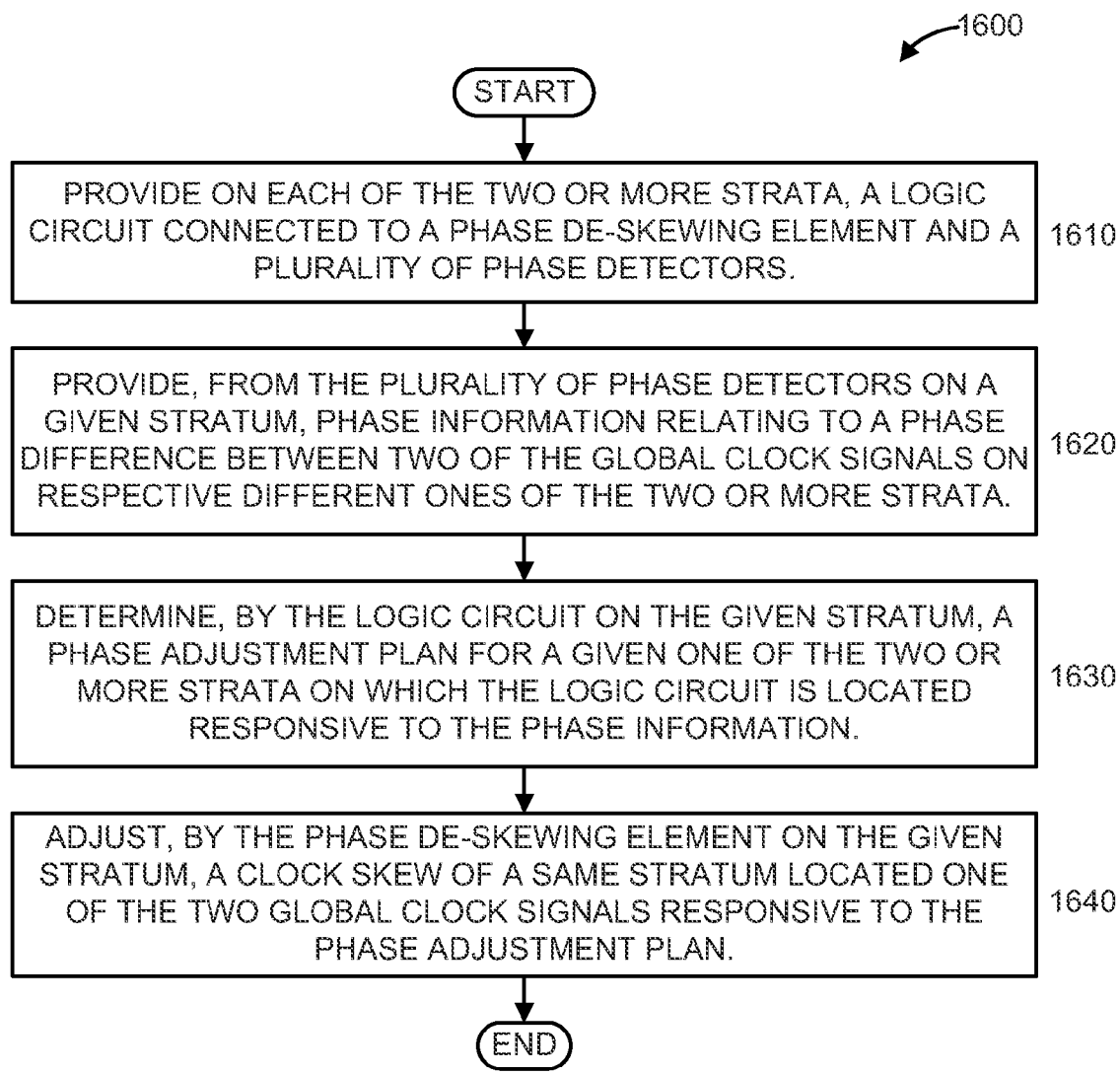
FIG. 16 shows a method 1600 for synchronizing global clock signals within a 3D chip stack having two or more strata, in accordance with an embodiment of the present principles.

FIG. 16 shows a method 1600 for synchronizing global clock signals within a 3D chip stack having two or more strata, in accordance with an embodiment of the present principles. At step 1610, provide on each of the two or more strata, a logic circuit connected to a phase de-skewing element and a plurality of phase detectors. Steps 1620, 1630, and 1640 that follow are performed for any one (e.g., one or more, up to all) of the two or more strata. At step 1620, provide, from the plurality of phase detectors on a given stratum, phase information relating to a phase difference between two of the global clocks signals on respective different ones of the two or more strata (that is, the given stratum and a different stratum with respect thereto).

At step 1630, determine, by the logic circuit on the given stratum, a phase adjustment plan for a given one of the two or more strata on which the logic circuit is located responsive to the phase information. At step 1640, adjust, by the phase de-skewing element on the given stratum, a clock skew of a same stratum located one of the two global clock signals responsive to the phase adjustment plan.

Figure 17:
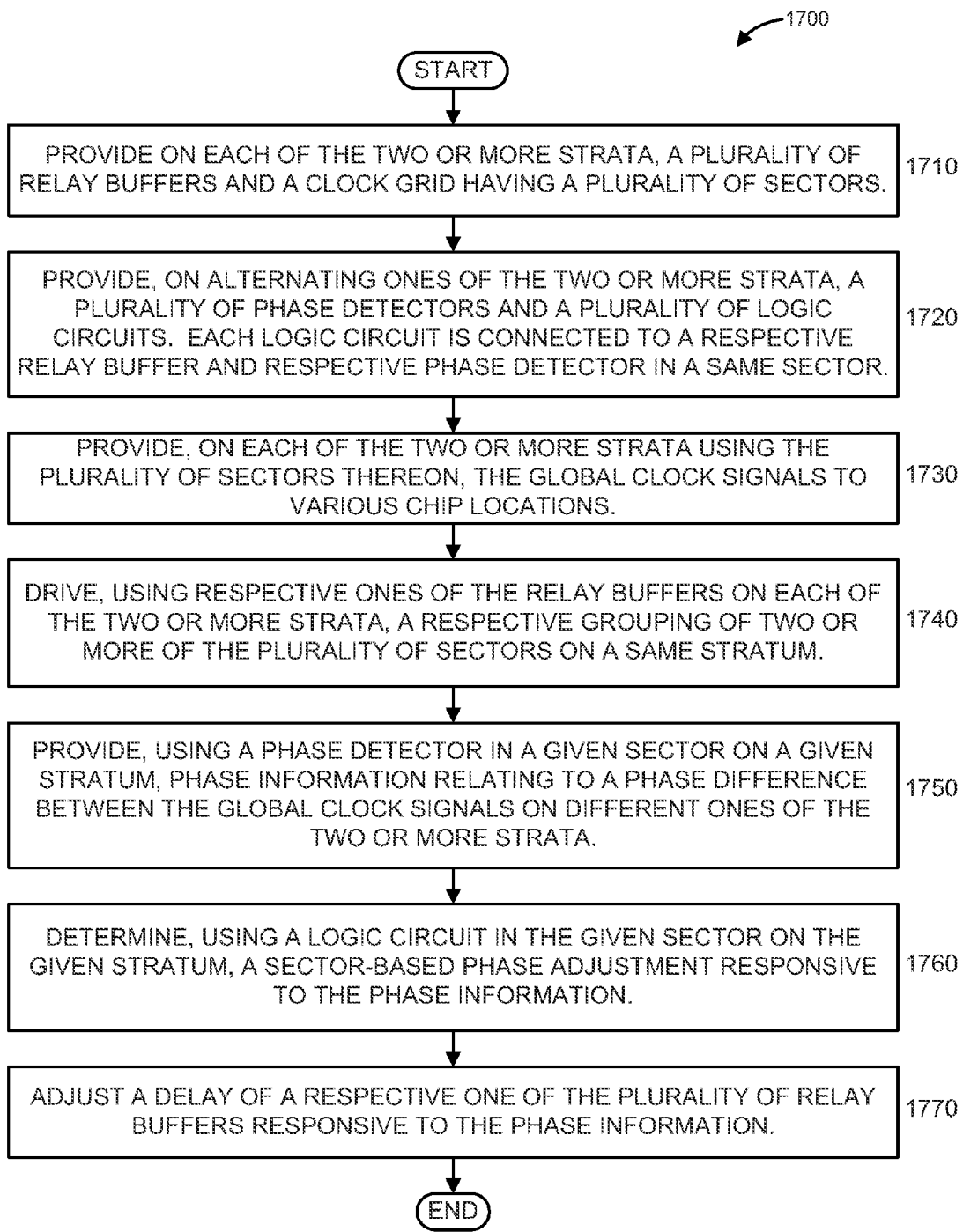
FIG. 17 shows another method 1700 for synchronizing global clock signals within a 3D chip stack having two or more strata, in accordance with an embodiment of the present principles.

FIG. 17 shows another method 1700 for synchronizing global clock signals within a 3D chip stack having two or more strata, in accordance with an embodiment of the present principles. At step 1710, provide on each of the two or more strata, a plurality of relay buffers and a clock grid having a plurality of sectors. At step 1720, provide on alternating ones of the two or more strata, a plurality of phase detectors and a plurality of logic circuits. Each of the logic circuits is connected to a respective one of the relay buffers and a respective one the plurality of phase detectors in a same one of the plurality of sectors. As used herein, "alternating" means every other one or some other pattern of alternating (e.g., every second one, every third one, etc.). Steps 1750, 1760, and 1770 are performed for the alternating ones of the two or more strata.

At step 1730, provide, on each of the two or more strata using the plurality of sectors thereon, the global clock signals to various chip locations.

At step 1740, drive, using respective ones of the relay buffers on each of the two or more strata, a respective grouping of two or more of the plurality of sectors on a same stratum.

At step 1750, provide, using a phase detector in a given sector on a given stratum, phase information relating to a phase difference between the global clocks signals on different ones of the two or more strata (that is, the given stratum and a different stratum with respect thereto).

At step 1760, determine, using a logic circuit in the given sector on the given stratum, a sector-based phase adjustment responsive to the phase information.

At step 1770, adjust a delay of a respective one of the plurality of relay buffers responsive to the determined phase adjustment.

A description will now be given of some of the many attendant advantages of the present principles.

One advantage of the present principles is the ability to manage inter-stratum clock skew in a 3D stacked chip. To that end, the present principles advantageously track static and low frequency layer-to-layer clock skew due to process (P), voltage (V) and temperature (T) variations. The skew can be very low and well managed.

Another advantage of the present principles is lower overheads such as low power and area overheads. The reduction in overheads depends on the spacing of phase detectors. In an embodiment, the spacing of phase detectors is, at a maximum, one (1) TSV per clock sector. Of course, other spacings can be used in accordance with the teachings of the present principles, while maintaining the spirit of the present principles.

Yet another advantage is that the present principles enable the testing of individual layers before bonding. Accordingly, yield is improved. Moreover, corner matching is enabled.

Still another advantage is that the present principles advantageously allow for different frequencies, clock loads and chip area for the layers in a 3D stack. To that end, we can make use of dividers to divide down the clock frequency before comparing in the phase detector. The clock signal that is not divided down will go through a matched delay.

A further advantage is that the present principles work for voltage and frequency scaling.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C), This may be extended, as readily apparent by one of ordinary skill in this and related arts, for as many items listed.

It is to be further appreciated that while one or more embodiments described herein may refer to the use of Silicon with respect to a chip or a through via, the present principles are not limited to using only chips or vias made from Silicon and, thus, chips or vias made from other materials including but not limited to Germanium and Gallium Arsenide may also be used in accordance with the present principles while maintaining the spirit of the present principles. Moreover, it is to be further appreciated that while one or more embodiments described herein may refer to the use of C4 or micro C4 (uC4) connections, the present principles are not limited to solely using C4 or micro C4 connections and, thus, other types of connections may also be used while maintaining the spirit of the present principles. The same applies for the through-Silicon vias described herein. Hence, examples of other chip-to-chip connections that may be used in stacked chips include micro-pillars, inductive coupling, and capacitive coupling.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A clock distribution network for synchronizing global clock signals within a 3D chip stack having two or more strata, the clock distribution circuit comprising:
   on each of the two or more strata,
      a plurality of phase detectors, each having a respective output for providing phase information relating to a phase difference between two of the global clocks signals on respective different ones of the two or more strata;
      a logic circuit connected to the respective outputs of the plurality of phase detectors for determining a phase adjustment plan for a given one of the two or more strata upon which the logic circuit is located responsive to the phase information; and
      a phase de-skewing element for adjusting a clock skew of a same stratum located one of the two of the global clock signals responsive to the phase adjustment plan.

2. The clock distribution circuit of claim 1, wherein at least one of the logic circuit and the phase de-skewing element is centrally located on a corresponding one of the two or more strata.

3. The clock distribution circuit of claim 1, further comprising a feedback loop between the two or more strata for tracking process, voltage, and temperature effects on the clock skew.

4. The clock distribution circuit of claim 1, further comprising, on each of the two or more strata, one or more multiplexers for providing the global clock signals thereto.

5. The clock distribution circuit of claim 4, wherein each of the one or more multiplexers provides respective ones of the global clock signals having a same phase or provides a same single clock source to each of the two or more strata.

6. The clock distribution circuit of claim 4, wherein one of the two or more strata is a master stratum and remaining ones of the two or more strata are non-master strata, and wherein the one or more multiplexers on the master stratum drive the one or more multiplexers on all of the non-master strata.

7. The clock distribution circuit of claim 1, further comprising a plurality of configurable scan chains, each including a scannable configuration register on a respective one of the two or more strata for storing outputs of the plurality of phase detectors from the respective one of the two or more strata.

8. The clock distribution circuit of claim 1, wherein the logic circuit comprises sum and compare circuitry for calculating a sum value from the respective outputs of the plurality of phase detectors on a same one of the two or more strata and determining the phase adjustment plan responsive to the sum value.

9. The clock distribution circuit of claim 1, wherein the phase de-skewing element on each of the two or more strata adjusts the clock skew of the same stratum located one of the two of the global clock signals to collectively align a mean global clock phase on each of the two or more strata.

10. The clock distribution circuit of claim 1, wherein each of the respective outputs of the plurality of phase detectors on each of two or more strata are weighted responsive to a location on that strata of a corresponding one of the plurality of phase detectors providing that output.

11. The clock distribution circuit of claim 1, wherein the logic circuit and the phase de-skewing element on each of the two or more strata are comprised within a respective same integrated chip.

12. A clock distribution network for synchronizing global clock signals within a 3D chip stack having two or more strata, the clock distribution circuit comprising:
on each of the two or more strata,
a clock grid having a plurality of sectors for providing the global clock signals to various chip locations;
a plurality of relay buffers, each for driving a respective grouping of two or more of the plurality of sectors on a same stratum,
on alternating ones of the two or more strata,
a plurality of phase detectors, each providing phase information relating to a phase difference between the global clocks signals on different ones of the two or more strata;
a plurality of logic circuits, each connected to a respective one of the relay buffers and a respective one the plurality of phase detectors in a same one of the plurality of sectors, for determining a phase adjustment responsive to the phase information;
wherein a delay of a respective one of the plurality of relay buffers is adjusted responsive to the determined phase adjustment.

13. The clock distribution circuit of claim 12, wherein the phase information is provided on a sector basis.

14. The clock distribution circuit of claim 12, wherein the global clocks on different ones of the two or more strata for which the phase information is provided comprises a global clock signal from a same one of the plurality of sectors as the phase detector providing the phase information and a global clock signal from a co-located one of the plurality of sectors on a different one of the two or more strata.

15. The clock distribution circuit of claim 12, further comprising, on each of the two or more strata, a plurality of sector clock buffers for driving the plurality of sectors, wherein each of the plurality of relay buffers drive the respective grouping of the two or more of the plurality of sectors on the same stratum through a corresponding two or more of the plurality of sector clock buffers on that stratum respectively connected thereto.

16. The clock distribution circuit of claim 15, wherein the respective one of the delay buffers equally applies the phase adjustment to each of the corresponding two or more of the plurality of sector clock buffers respectively connected thereto on the same stratum.

17. The clock distribution circuit of claim 12, wherein the phase adjustment is only applied between groupings of the plurality of sectors without modifying a global clock phase within any of the groupings.

18. The clock distribution circuit of claim 12, wherein each of the plurality of logic circuits is responsive to a receipt of an enable signal, the enable signal being scanned into each of the plurality of logic circuits one at a time to enable reading of an output of a corresponding one of the plurality of phase detectors and making of the phase adjustment by a single time step.

19. The clock distribution circuit of claim 18, wherein each of the plurality of logic circuits is responsive to a sector lock signal that terminates the phase adjustment.

20. A method for synchronizing global clock signals within a 3D chip stack having two or more strata, the method comprising:
providing on each of the two or more strata, a plurality of phase detectors, a logic circuit, and a phase de-skewing element;
for any one of the two or more strata;
providing, from the plurality of phase detectors thereon, phase information relating to a phase difference between two of the global clocks signals on respective different ones of the two or more strata;
determining, by the logic circuit thereon, a phase adjustment plan for a given one of the two or more strata upon which the logic circuit is located responsive to the phase information; and
adjusting, by the phase de-skewing element, a clock skew of a same stratum located one of the two of the global clock signals responsive to the phase adjustment plan.

\* \* \* \* \*